United States Patent [19]

Asakawa

[11] Patent Number: 5,306,163
[45] Date of Patent: Apr. 26, 1994

[54] DESTATICIZED CONNECTOR STRUCTURE

[75] Inventor: Kazushige Asakawa, Yokohama, Japan

[73] Assignee: Molex Incorporated, Lisle, Ill.

[21] Appl. No.: 936,956

[22] Filed: Aug. 27, 1992

[30] Foreign Application Priority Data

Oct. 30, 1991 [JP] Japan ................. 3-97306

[51] Int. Cl.$^5$ ............................................. H01R 9/09
[52] U.S. Cl. ........................................ 439/74; 439/607
[58] Field of Search ................... 439/55, 70, 71, 72, 439/74, 78, 82, 83, 607, 609, 862

[56] References Cited

U.S. PATENT DOCUMENTS

| | | | |
|---|---|---|---|
| 4,527,848 | 7/1985 | Velsher et al. | 439/358 X |
| 4,857,001 | 8/1989 | Nakano et al. | 439/78 X |
| 4,891,019 | 1/1990 | Olsson | 439/404 |
| 5,002,495 | 3/1991 | Tanaka | 439/108 |
| 5,055,054 | 10/1991 | Doutrich | 439/66 |
| 5,104,326 | 4/1992 | Smith et al. | 439/79 X |
| 5,161,985 | 11/1992 | Ramsey | 439/74 |

FOREIGN PATENT DOCUMENTS 3-44868  4/1991  Japan .

*Primary Examiner*—Larry I. Schwartz
*Assistant Examiner*—Khiem Nguyen
*Attorney, Agent, or Firm*—Stephen Z. Weiss

[57] ABSTRACT

A connector is disclosed which draws static charges to ground. The connector comprises a male plug having a generally non-yielding terminal attached to a projection extending from its mating surface and a female receptacle having at least one terminal mounting cavity in a mating surface and a flexible female terminal in the cavity. The female receptacle has a metal cover on its outer surface which is connected to ground. The male terminal and projection is dimensioned so as to permit insertion through the aperture in the cover and into a slot in the female housing. The flexible female terminal remains contained within the slot of the female housing and below the cover prior to making contact with the male terminal.

3 Claims, 7 Drawing Sheets

DESTATICIZED CONNECTOR STRUCTURE

BACKGROUND OF THE INVENTION

Field of the Invention

The present invention relates to a static charge removal connector to make an electric connection between two printed circuit boards or other electrical parts.

Board-to-Board electric connectors have been widely used, and some electric connectors have been equipped with static change removal means to prevent the flow of static electricity from a person handling the connector to its terminals. An example of such a static charge removal connector is shown in U.S. Pat. No. 5,002,495. The connector in this patent comprises a female receptacle which mates with a male plug. The male plug has a plurality of flat male terminals attached to its housing. The female receptacle has a plurality of terminals corresponding to the male terminals and springs on each end of the plurality of terminals with one end of the spring attached to a printed circuit board and the other end in contact with a hinged metal cover. The springs are designed to resiliently contact the inner surface of the metal cover and bias the cover in the open position. The metal cover has hinges on its opposite sides and slots made on its major surface to allow the female terminals to appear above the metal cover only when the cover is in the closed position. Before the male plug is inserted in the female receptacle, the metal cover is in its raised open position, thus protecting all the female terminals between the raised metal cover and the top surface of the housing of the female receptacle.

In use, a person cannot contact the female receptacle without touching the metal cover, thus permitting discharge of the static electricity from the person's body. This static charge removal connector, however, has a number of defects. First, providing a hinge to the metal cover on the receptacle housing requires manufacturing techniques too complicated to be performed by machine thereby requiring labor intensive manufacturing techniques. Second, the moving parts of the electric connector are liable to be worn by friction, thereby shortening the life of the device. Third, the electric connector in its open position permits the inadvertent touching to the sides of the female terminals by hard objects or dust under the cover, thus causing deformation or contamination of contact surfaces resulting in incomplete electric connections. Fourth, the electric connector does not allow for variations in dimensions in the printed circuit board and or the housings to which the connectors are mounted while still providing electrical contact.

SUMMARY OF THE INVENTION

One object of the present invention is to provide an improved static charge removal connector which requires simple manufacturing techniques by attaching a metal cover to a receptacle housing. Another object of the present invention is to provide such a static charge removal connector equipped with a grounding metal cover, which is simple, stout and durable, guaranteed free of contamination or deformation of female terminals and allowing for minor variations in dimensions which could cause connector mismatch.

To attain these objects a static charge removal connector according to the present invention is provided comprising a male plug including a male housing having a base, a mount, and at least one male terminal fixed to the mount, and a female receptacle including a female housing having at least one terminal mounting cavity and a flexible female terminal in the cavity. The female housing has a metal cover integrally connected to ground bars and applied to a top surface of the housing where the cover has apertures through which the mount with the male terminal can be inserted. The terminal mount projecting from a floor of the housing of the male plug, and physically dimensioned so as to permit insertion through the aperture in the cover and into a slot in the female housing. The male terminal is fixed to the terminal mount with the contact section of the male terminal laid on the top of the terminal mount, thus permitting the contact section of the male terminal to come into contact with the contact section of the flexible female terminal when the male plug is mated with the female receptacle. The female terminal which is yieldingly deformable remains contained within the slot of the female housing prior to making contact with the counter male terminal.

According to another aspect of the present invention the female terminal comprises a base section having two ends mounted within the female housing, one end integrally connected to a solder tail section adapted to be connected to a trace on a printed circuit board and the other end integrally connected to a flexible bent section. A flexible arm extending from the other end of the flat contact section supports that other end of the flat contact section. Support of the flat contact section by both the flexible bent section and the flexible arm allows the flat contact section to provide a generally equal force against a mating male terminal across the entire length of flat contact section.

According to still another aspect of the present invention the metal cover comprises front, rear and opposite side sections to cover corresponding front, rear and opposite side surfaces of the female housing. The opposite side sections have ground pieces integrally connected.

According to still another aspect of the present invention a plurality of female terminals are contained within slots arranged at regular intervals in staggered relation in said female housing and a plurality of male terminals are arranged in the male housing at the same regular intervals in staggered relation as the intervals of the female terminals.

When the male plug is mated with the female receptacle, the terminal mounts of the male plug are inserted in the apertures of the receptacle housing until the male terminals come to contact the female terminals in the receptacle housing. The dimensions of the male terminal mounts are smaller than the dimensions of the apertures allowing for a slight mismatch of the terminals due to slight variation in dimensions. The static electricity is discharged from the body of the person handling the connector to the metal cover of the female receptacle. The metal cover is fixed to the receptacle housing to cover its front, rear, opposite, side and top surfaces except for the apertures in the top surface through which insertion of the male terminal mounts and terminals is permitted. The metal cover can be attached to the receptacle housing with ease, and therefore, permitting attachment by machine of metal covers to receptacle housing. The metal cover is stout and durable because it is attached to the receptacle housing and because it has no moving parts. Also, the female terminals which are within and partially protected by the substantially closed housing providing freedom of deformation and contamination.

BRIEF DESCRIPTION OF THE DRAWINGS

Other objects and advantages of the present invention will be understood from the following description of a static charge removal connector according to a preferred embodiment of the present invention, which is shown in accompanying drawings.

DESCRIPTION OF THE PREFERRED EMBODIMENT

Figure 1:
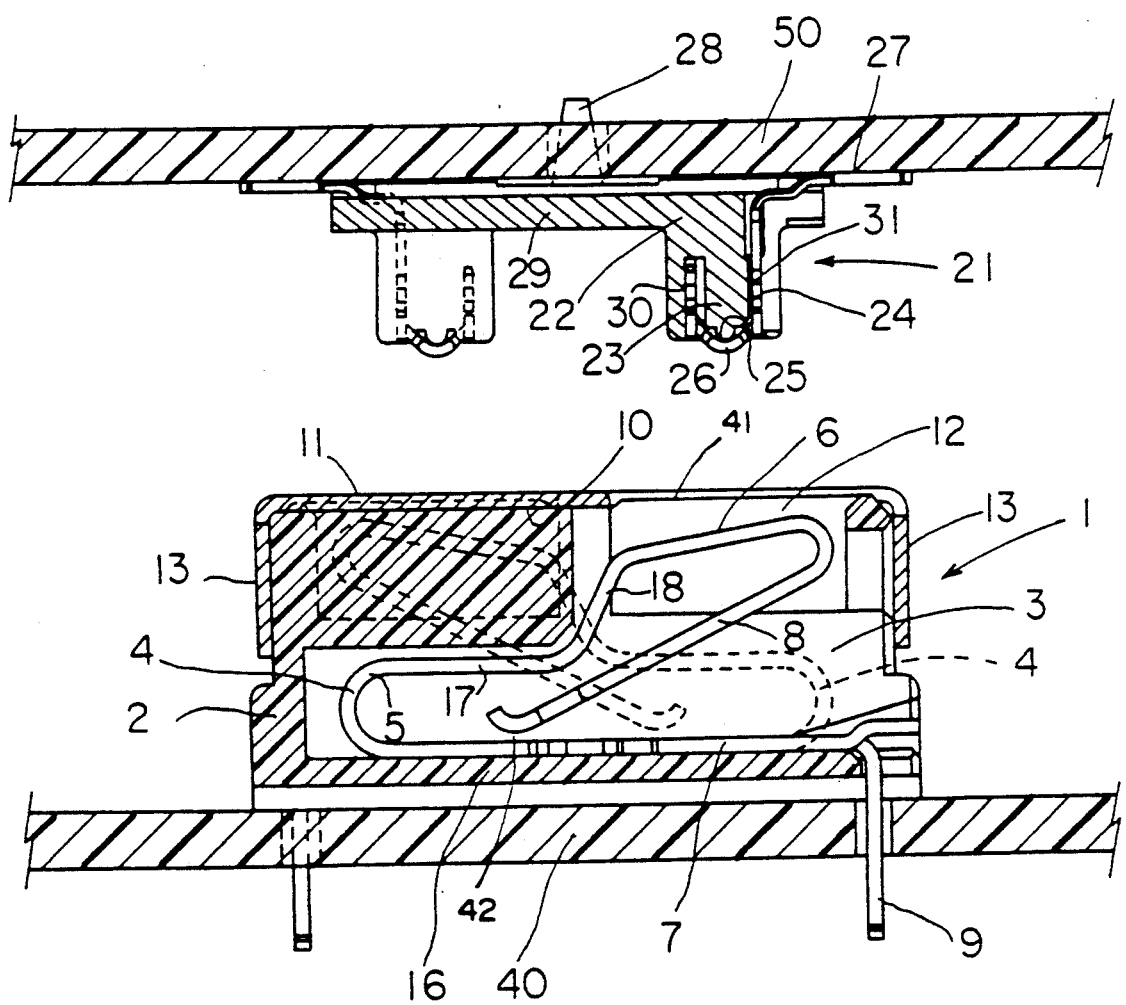
FIG. 1 schematically shows a male plug and a female receptacle of a static charge removal connector according to the present invention before mating with each other.
Figure 2:
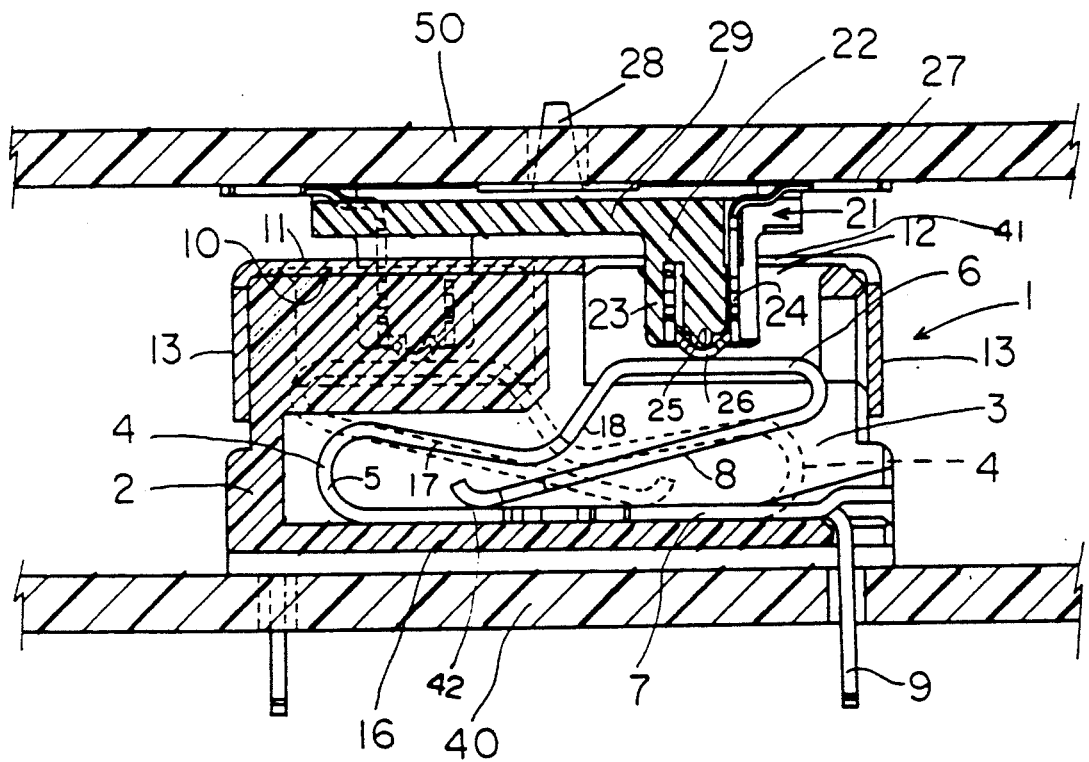
FIG. 2 schematically shows the male plug and the female receptacle of FIG. 1 when mated together.
Figure 3:
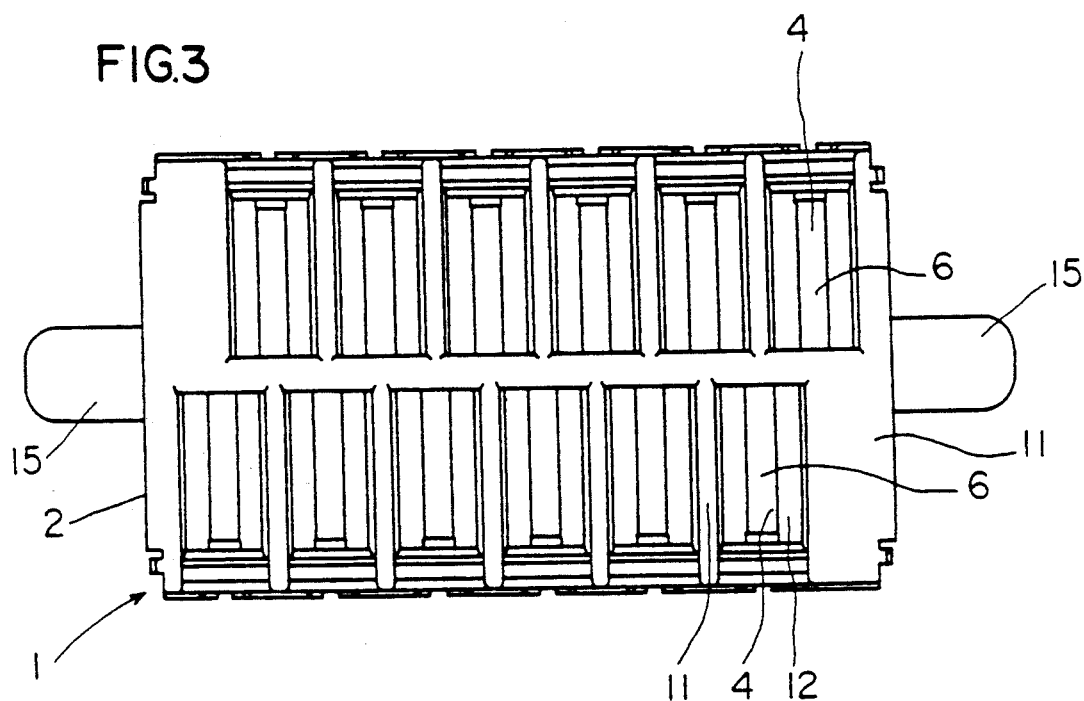
FIG. 3 is a plane view of the female receptacle.
Figure 4:
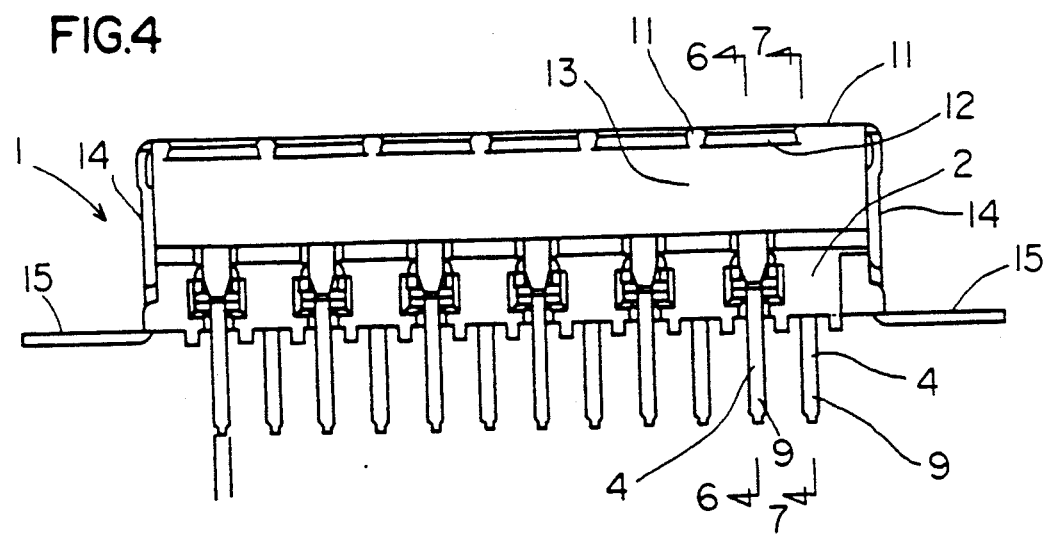
FIG. 4 is a front view of the female receptacle.
Figure 5:
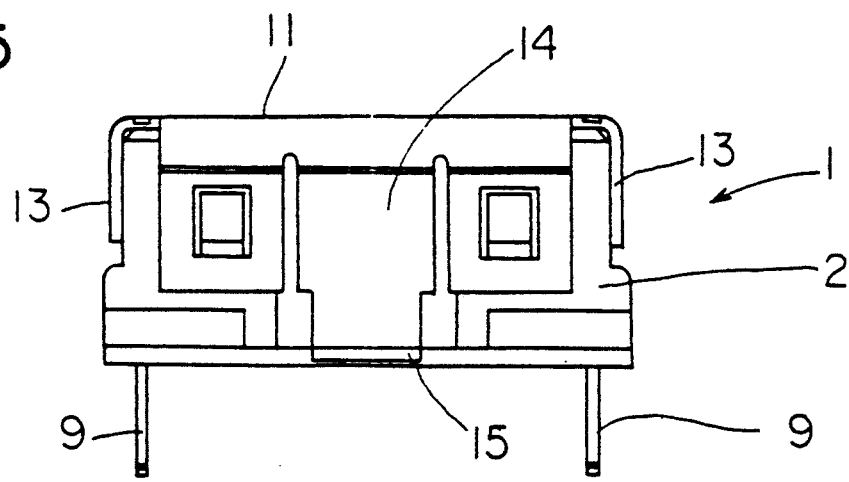
FIG. 5 is a right side view of the female receptacle.
Figure 6:
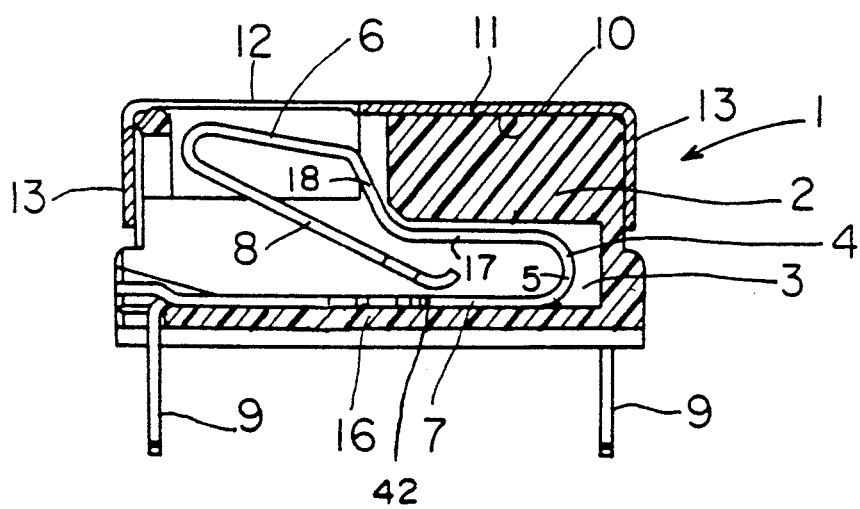
FIG. 6 is a sectional view taken along the line 6—6 in FIG. 4.
Figure 7:
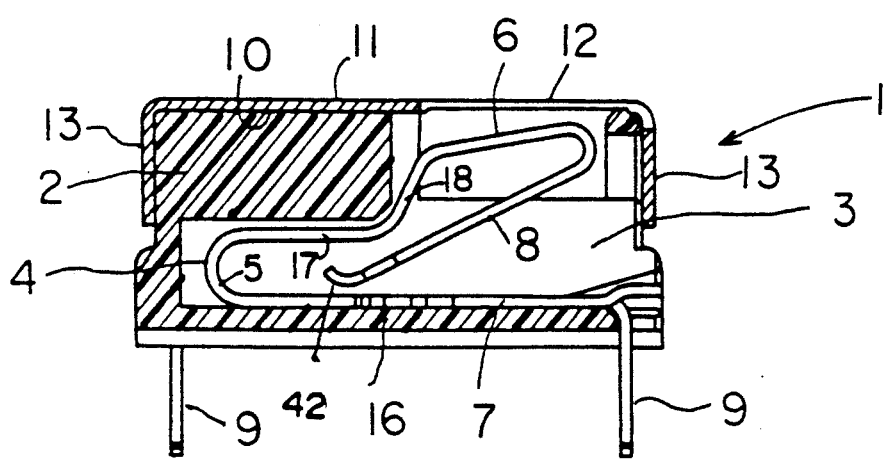
FIG. 7 is a sectional view taken along the line 7—7 in FIG. 4.

FIG. 1 shows schematically a male plug 21 and a female receptacle 1 of a static charge removal connector according to the present invention before mating with each other. FIG. 2 schematically shows the male plug 21 and the female receptacle 1 when mated together. The male plug 21 is attached to a printed circuit board 50 and the female receptacle is attached to another printed board 40. FIGS. 3 to 7 show the female receptacle 1 and FIGS. 8 to 15 show the male plug 21 and associated male terminals 24.

The female receptacle 1 has a hollow housing 2 covered with a metal cover 11. The housing 2 has a female terminal mount 3, which has a plurality of slots 12 in alignment with the apertures 41 made in the metal cover 11. Female terminals 4 are fitted in these slots 12 of the female terminal mount 3. The female terminal comprises a solder tail section 9, a base section 7, a bent section 5, a horizontal section 17, a steep-inclined section 18, a slow-inclined contact section 6, and a bend-and-return section 8 integrally formed in the sequentially consecutive named order. When the contact section 26 of each male plug 21 is brought into contact with the counter female terminal 4, the female contact 4 will be yieldingly deformed within slot 12 of the female terminal mount 3. The entire female terminal 4 is within the slot 12 of the female terminal mount 3, leaving nothing exposed. The top surface 10 of the housing 2 is covered by metal cover 11 except for the apertures 41 in alignment with slots 12, thereby permitting insertion of terminal mounts 23 and the male terminals 24. The cover 11 is adapted to cover the surface 10 of the housing 2, and at the same time to cover the front, rear and opposite sides of the housing 2. The opposite sides 14 of the metal cover 11 have horizontal ground pieces 15 integrally connected thereto.

Figure 8:
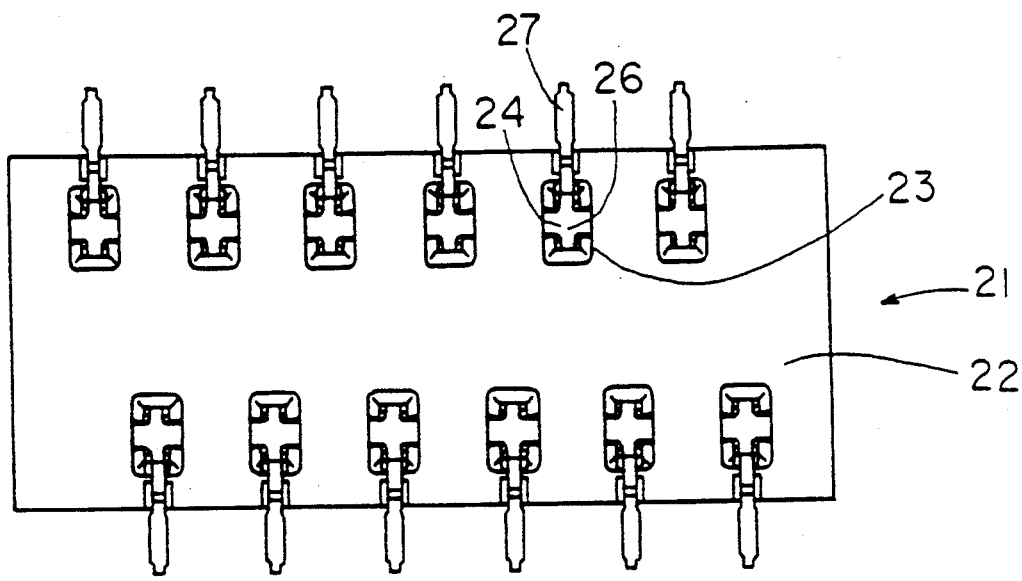
FIG. 8 is a plane view of the male plug.
Figure 9:
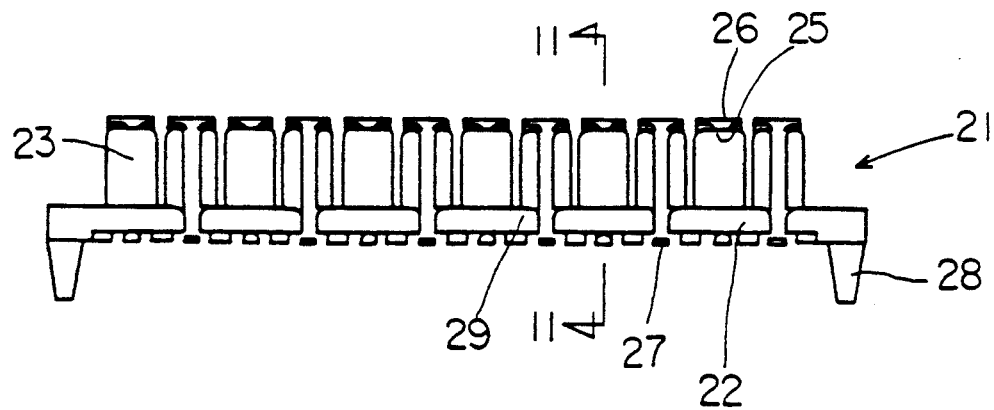
FIG. 9 is a front view of the male plug.
Figure 10:
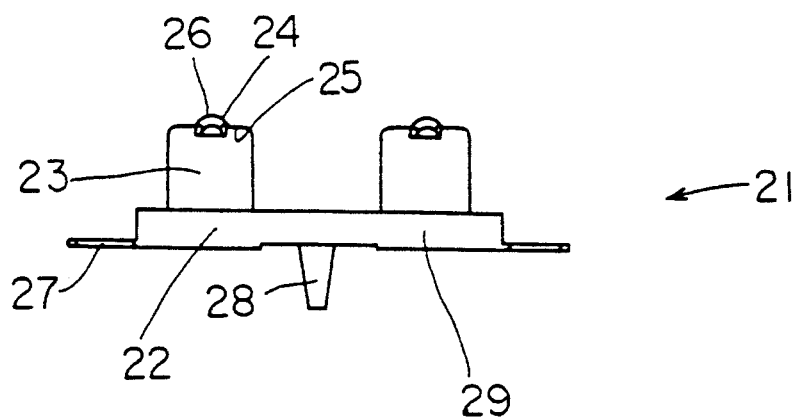
FIG. 10 is a right side view of the male plug.
Figure 11:
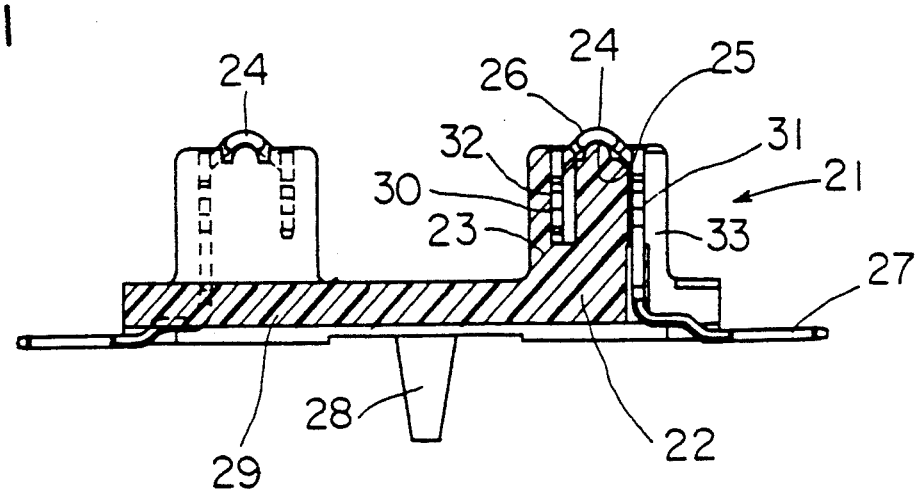
FIG. 11 is a sectional view taken along the line 11—11 in FIG. 9.

Referring to FIG. 8 and subsequent drawings, the male plug 21 has a housing 22 with a flat base 29 and terminal mounts 23 erected thereon. Each terminal mount 23 is physically dimensioned so as to fit within slot 12 in the female receptacle 1. As shown in FIG. 1, dimension A on terminal mount 23 is smaller than dimension B of the aperture 41 and slots 12. This allows the curved contact section 26 of the male terminal 24 a larger area around contact section 6 of the female terminal to make electrical contact. Male terminal 24 is fixed to each terminal mount 23 by fitting edges into grooves within the terminal mount 23 with its curved contact section 26 laid on the top of the terminal mount 23.

Figure 12:
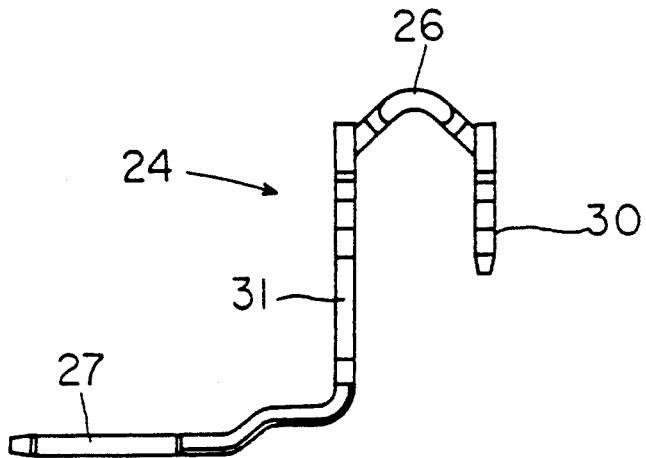
FIG. 12 is a front view of a male terminal.
Figure 13:
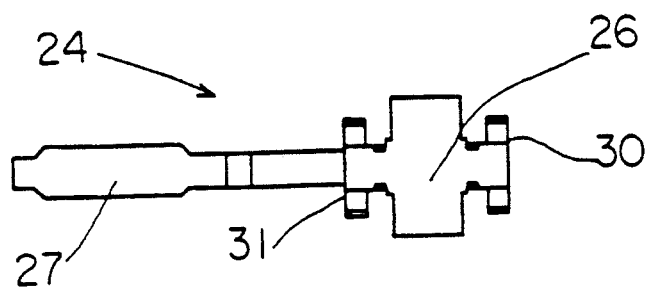
FIG. 13 is a plane view of the male terminal.
Figure 14:
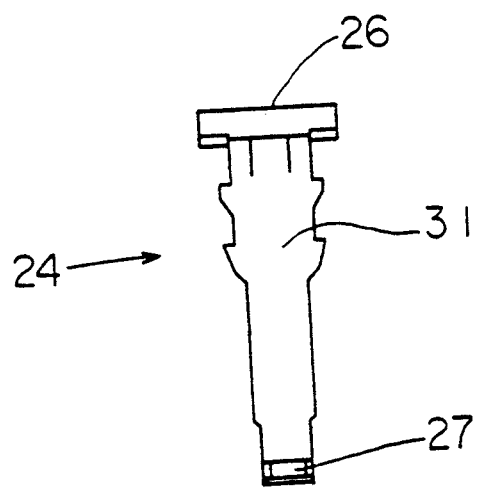
FIG. 14 is a left side view of the male terminal.
Figure 15:
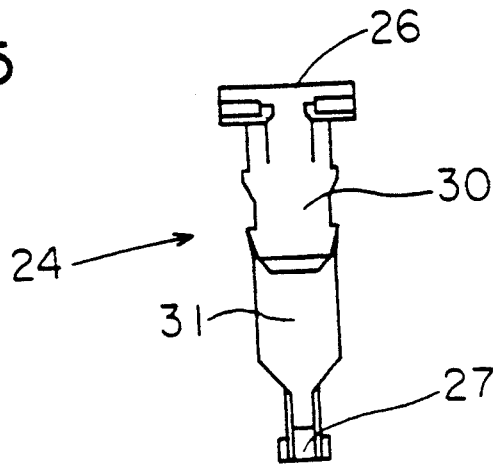
FIG. 15 is a right side view of the male terminal.

As shown in FIG. 12, a male terminal 24 consists of a descending front extension 30, a curved contact section 26, a descending rear extension 31 and a horizontal rear extension or a solder tail 27 which are integrally formed together, consecutively in the order named. The descending front extension 30 of the male terminal 24 is inserted in the longitudinal hole 32 in the terminal mount 23 whereas the descending rear extension 31 is fitted in the groove 33 in the terminal mount 23. As seen from FIG. 11, attaching piece 28 are integrally connected to the back surface of the base 29.

As seen from FIG. 1, all female terminals 4 are concealed within the receptacle housing 2, particularly in the slots 12 of the receptacle housing 2. The contact sections 6 of the female terminals 4 do not appear beyond the outside surface of the metal cover 11 in the decoupling position of the static charge removal connector. Therefore, the contact sections 6 of the female terminals 4 cannot be deformed or contaminated by inadvertent application of undesired forces.

In the course of transition from the decoupling position of FIG. 1 to the coupling position of FIG. 2, the static electricity if any, will be discharged from the body of a person handling the static charge removal connector through the cover 11, thus assuring that such static electricity will not flow in the male or female terminals. As seen from FIG. 2, the male plug 21 is coupled with the female receptacle 1 by inserting the terminal mounts 23 of the male plug 2 through the apertures 41 of the cover 11 and in the slots 12 of the receptacle housing 2. Each male terminal 24 will contact the counter female terminal 4 by their contact section 26 and 6, thus making an electric connection between the two printed boards 40 and 50. The female terminals 4 are yieldingly bent at their bend sections 5 until the tips 42 of the bend-and-return sections 8 have contacted the terminal base section 7 which is just above the upper surface of the base 16. The force of the bend-and-return section 8 supporting one end of the contact section 6 and the force of the steep inclined section 18 supporting the other end of the contact section 6 will ensure that contact section 6 will exert an equal upward force opposite the male contact section 26 anywhere along contact section 6. This will cause a good contact pressure on each male terminal. The contact section 6 of each female terminal 4 will also be placed and maintained in a horizontal position, thus permitting even contact with the counter contact section 26 of the male terminal 24 at an increased area.

The above description is directed only to a pair of male and female terminals for the sake of simplicity. It should be noted that a plurality of slots 12 are staggered at regular intervals in the housing 2 of the female receptacle 1, each having a female terminal 4 located therein. Accordingly, the contact sections 6 of the female terminals 4 are arranged in staggered relation, as best seen from FIG. 6 and 7, which are cross sections taken along the line 6—6 and line 7—7 in FIG. 4. Likewise, a plurality of terminal mounts 23 are staggered on the base 29 of the male plug 21, and accordingly the male terminals 24 are staggered.

What is claimed is:

1. A static charge removal connector comprising:

a male plug (21) including a male housing (22) having a base, a terminal mount (23), and at least one male terminal (24) fixed to the terminal mount (23);

a female receptacle (1) comprising a female housing (2) having at least one terminal mounting cavity (3) and a flexible female terminal (4) in the cavity, said female housing (2) having a metal cover (11) integrally connected to ground bars (15) and applied to a top surface (10) of said female housing (2) said cover (11) having apertures (41) through which said terminal mount (23) with said male terminal (24) can be inserted;

said terminal mount (23) projecting from a floor (29) of the male housing (22) of the male plug (21), and physically dimensioned so as to permit insertion through the aperture (41) in said cover (11) and into a slot (12) in the female housing (2), said male terminal (24) being fixed to said terminal mount (23) with a contact section (26) of said male terminal (24) laid on the top of said terminal mount (23), thus permitting the contact section (26) of said male terminal (24) to come to contact the contact section (6) of said flexible female terminal (4) when said male plug (21) is mated with said female receptacle (1); and said female terminal (4) which is yieldingly deformable remains contained within slot (12) of said female housing (2) prior to making contact with the male terminal (24), said female terminal having a base section (7) with two ends mounted within said female housing (2), one end integrally connected to a solder tail section (9) adapted to be connected to a trace on a printed circuit board and the other end integrally connected to a flexible bent section (5) which supports one end of a flat contact section (6) with the other end of the flat contact section (6) supported by a flexible arm (8), whereby the upward force provided by the flat contact section (6) against the male terminal (24) due to the support at both ends of the flat contact section by the flexible bent section (5) and the flexible arm (8) is generally equal across the entire length of the contact section (6).

2. A static charge removal connector according to claim 1 wherein said metal cover (11) comprises front, rear and opposite side sections (13) and (14) to cover corresponding front, rear and opposite side surfaces of said female housing (2), said opposite side sections (14) having ground pieces (15) integrally connected.

3. A static charge removal connector according to claim 2 wherein a plurality of female terminals (4) are contained within slots (12) arranged at regular intervals in staggered relation in said female housing (2) and wherein a plurality of male terminals (24) are arranged in said male housing (22) at the same regular intervals in staggered relation as the intervals of the female terminals.

* * * * *